United States Patent [19]
Sproul et al.

[11] Patent Number: 5,942,089
[45] Date of Patent: *Aug. 24, 1999

[54] METHOD FOR SPUTTERING COMPOUNDS ON A SUBSTRATE

[75] Inventors: William D. Sproul, Palatine; Michael E. Graham, Evanston, both of Ill.

[73] Assignee: Northwestern University, Evanston, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/635,472

[22] Filed: Apr. 22, 1996

[51] Int. Cl.$^6$ .................................................. C23C 14/34
[52] U.S. Cl. ........................... 204/192.13; 204/192.15; 204/192.16; 204/192.22; 204/192.23; 204/192.25; 204/298.03; 204/298.07; 204/298.06; 204/298.08; 204/298.14
[58] Field of Search ................... 204/192.13, 192.15, 204/192.22, 192.23, 192.25, 298.03, 298.07, 298.08, 298.14, 298.26, 298.06, 192.16

[56] References Cited

U.S. PATENT DOCUMENTS

| | | | |
|---|---|---|---|
| 4,428,811 | 1/1984 | Sproul et al. | 204/192.13 |
| 4,963,239 | 10/1990 | Shimamura et al. | 204/298.08 |
| 5,303,139 | 4/1994 | Mark | 204/298.08 |
| 5,492,606 | 2/1996 | Stauder et al. | 204/298.08 |
| 5,556,520 | 9/1996 | Latz | 204/192.13 |

FOREIGN PATENT DOCUMENTS 0 564 789  10/1993  European Pat. Off. .

OTHER PUBLICATIONS

Sellers, "Asymmetric Bipolar Pulsed DC—The Enabling Technology for Reactive PVD", ENI Tech Note, pp. 1–8, Feb. 1996.

William D. Sproul, HIgh Rate Reactive Sputtering Process Control, *Surface and Coatings Technology*, 33 (1987) 73–81.

William D. Sproul and Paul J. Rudnik, The Effect of Target Power on the Nitrogen Partial Pressure Level and Hardness of Reactively Sputtered Titanium Nitride Coatings, *Thin Solid Films*, 171 (1989) 171–181.

W. D. Sproul and P. J. Rudnik, Advances in Partial–Pressure Control Applied to Reactive Sputtering, *Surface and Coatings Technology*, 39/40 (1989) 499–506.

(List continued on next page.)

*Primary Examiner*—Nam Nguyen
*Assistant Examiner*—Rodney G. McDonald
*Attorney, Agent, or Firm*—Banner & Witcoff, Ltd.

[57] ABSTRACT

A method and apparatus for monitoring and controlling deposition of metal, insulating compounds or other compounds on a substrate by sputtering techniques includes maintaining pulsed, constant, direct current power to the target, sensing the voltage of the target material used in the process, simultaneously rapidly sensing the partial pressure of the reactive gas, and simultaneously biasing the substrate to activate the reactive gas or otherwise energizing the reactive gas in the vicinity of the substrate. An apparatus for practicing the invention is also disclosed.

13 Claims, 5 Drawing Sheets

OTHER PUBLICATIONS

W. D. Sproul, P. J. Rudnik and M. E. Graham, The Effect of $N_2$ Partial Pressure, Deposition Rate and Substrate Bias Potential on the Hardness and Texture of Reactively Sputtered TiN Coatings, *Surface and Coatings Technology*, 39/40 (1989) 355–363.

X. Chu, M.S. Wong, W. D. Sproul, S. L. Rohde and S. A. Barnett, Deposition and Properties of Polycrystalline TiN/NbN Superlattice Coatings, *J. Vac Sci. Technol. A* 10(4), Jul./Aug. 1992.

William D. Sproul, *Control of A Reactive Sputtering Process For Large Systems*, Presented at the Society of Vacuum Coaters 36th Annual Technical Conference, Dallas, Texas, Apr. 30, 1993.

J. Affinito and R. R. Parsons, Mechanisms of Voltage Controlled, Reactive, Planar Magnetron Sputtering of Al in $Ar/N_2$ and $AR/O_2$ Atmospheres, J. Vac. Sci. Technol. A 2(3), Jul.–Sep. 1984.

S. Schiller, K. Goedicke, J. Reschke, V. Kirchhoff, S. Schneider and F. Milde, Pulsed Magnetron Sputter Technology, *Surface and Coatings Technology*, 61 (1993) 331–337.

P. Frach, U. Heisig, Chr. Gottfried and H. Walde, Aspects and Results of Long–Term Stable Deposition of $Al_2O_3$ With High Rate Pulsed Reactive Magnetron Sputtering, *Surface and Coatings Technology*, 59 (1993) 177–182.

W. D. Sproul, M. E. Graham, M. S. Wong, S. Lopez, and D. Li, Reactive Direct Current Magnetron Sputtering of Aluminum Oxide Coatings. J. Vac. Sci. Technol. A 13(3), May/Jun. 1995.

William D. Sproul, Michael E. Graham, Ming–Show and Paul J. Rudnik, Reactive DC Magnetron Sputtering of the Oxides of Ti, Zr, and Hf, Presented at the International Conference on Metallurgical Coatings and Thin Films, Town and Country Hotel, San Diego, California, Apr. 24–28, 1994 and Submitted for publication in *Surface and Coatings Technology*.

FIG. 1
Schematic of Sputtering System

METHOD FOR SPUTTERING COMPOUNDS ON A SUBSTRATE

BACKGROUND OF THE INVENTION

Briefly, the present invention relates to a method and apparatus for sputtering of a thin film of a compound onto a substrate workpiece by means of cathodic, magnetron sputtering.

Application of metals and metallic compounds by use of a reactive deposition process is known and is the subject, for example, of U.S. Pat. No. 4,428,811, "Rapid Rate Reactive Sputtering Of A Group IVB Metal" issued Jan. 31, 1984, incorporated herewith by reference. U.S. Pat. No. 4,428,811 discloses a method and apparatus for rapid rate deposition of metallic compounds such as titanium nitride onto a substrate in a vacuum chamber. In the process, the chamber is filled with inert gas that is ionized and bombards the metal target within the chamber to initiate the sputtering process. A substrate is positioned within the chamber for coating, and a second reactive gas is fed into the chamber at a measured rate to combine at the substrate with the atomized metal from the target to form the coating. Control systems for such sputtering operations are also disclosed in the aforesaid patent.

Over the years, the technology associated with sputtering processes has been improved so that additional compounds and materials can be applied to a substrate by. A series of papers by the co-inventor reflect research in this area including the following:

1. "High Rate Reactive Sputtering Process Control," published in *Surface and Coatings Technology*, 1987;

2. "The Effect of Target Power on the Nitrogen Partial Pressure Level and Hardness of Reactively Sputtered Titanium Nitride Coatings," published in *Thin Solid Films*, 1989;

3. "Advances in Partial-Pressure Control Applied to Reactive Sputtering," published in *Surface and Coatings Technology*, 1989;

4. "The Effect of $N_2$ Partial Pressure, Deposition Rate and Substrate Bias Potential on the Hardness and Texture of Reactively Sputtered TiN Coatings," published in *Surface and Coatings Technology*, 1989;

5. "Deposition and Properties of Polycrystalline TiN/NbN Superlattice Coatings," published in *J. Vac. Sci. Technol.* A 10/4, July/August 1992; and 6. "Control of a Reactive Sputtering Process for Large Systems," a paper presented at the Society of Vacuum Coaters, 36th Annual Technical Conference, Dallas, Tex., Apr. 30, 1993.

The text of these publications is incorporated herewith by reference.

The energy source which effects the ionization of the inert gas in a sputtering system has evolved over time so that now pulsed, direct current electrical power is known to be a preferred energy source to the target material. Publications relating to this technique and technology include the following:

7. "Mechanisms of Voltage Controlled, Reactive, Planar Magnetron Sputtering of Al in $Ar/N_2$ and $Ar/O_2$ Atmospheres," published in *J. Vac. Sci. Technol.* A 2(3), July–September 1984; and 8. "Pulsed Magnetron Sputter Technology," published in *Surface and Coatings Technology*, 1993.

These publications are incorporated herewith by reference.

Sputtering techniques for the application of pure metals are fairly well refined and effective. Additionally, sputtering techniques for conductive or non-insulating compounds have been somewhat successful utilizing the techniques described in the aforesaid publications. However, certain materials, which provide an insulating, hard coating upon a substrate are difficult to apply as a film or may not be efficiently applied using such sputtering techniques. Aluminum oxide, for example, has heretofore been applied by sputtering techniques to a substrate at only a small fraction of the rate and efficiency of the application associated with the pure aluminum metal. Thus, low deposition rates of insulating or non-conductive metal compounds have continued to pose a challenge. Publications that reflect research regarding the sputtering of such compounds include the following, which are incorporated herewith by reference:

9. "Aspects and Results of Long-Term Stable Deposition of $Al_2O_2$ with High Rate Pulsed Reactive Magnetron Sputtering," published in *Surface and Coatings Technology*, 1993;

10. "Reactive Direct Current Magnetron Sputtering of Aluminum Oxide Coatings," *J. Vac. Sci. Technol.* A 13(3), May/June 1995; and 11. "Reactive DC Magnetron Sputtering of the Oxides of Ti, Zr, and Hf," presented at the International Conference on Metallurgical Coatings and Thin Films, Town and Country Hotel, San Diego, Calif., Apr. 24–28, 1995, and accepted for publication in *Surface and Coatings Technology*.

In sum, there has remained a need to provide an improved method and apparatus for the deposition of metallic, insulating compounds such as aluminum oxide, on a substrate using sputtering techniques.

SUMMARY OF THE INVENTION

In a principal aspect, the present invention comprises a method for deposition of various compounds, especially insulating, metallic compounds such as aluminum oxide, on a substrate as a thin film by sputtering techniques utilizing a pulsed, constant power, direct current electric power supply to cause ionization of an inert gas that bombards a target thereby releasing the atoms of the target into a vacuum chamber and further controlling the rate of admission and thus the reaction of a second, reactive gas to the chamber with a combination of control signals. Specifically, the rate of admission is controlled by a first signal derived from the measured voltage of the target which is maintained at a constant power setting. The rate of admission is further controlled by a second signal derived from the measured partial pressure of the reactive gas. The partial pressure of the reactive gas is sensed by means such as an optical gas controller or mass spectrometer, as well as the target voltage, is sensed to provide control signals representative of the desired composition and physical characteristics of the thin film. The desired composition and physical characteristics are derived empirically for given target materials, reactive gases and power settings. To further enhance the thin film deposition process, the reactive gas at or near the substrate is subjected to local energy input, for example, by applying pulsed direct current to the substrate. By the method, it is possible to carefully control the amount of reactive gas in the system and thereby increase the rate of deposition of the compound multiple times the rate of deposition using prior sputtering techniques.

Thus, it is an object of the invention to provide an improved method and apparatus for deposition of compounds on a substrate by sputtering techniques.

It is a further object of the invention to provide an improved method for deposition by sputtering of compounds including oxides, nitrides, fluorides, sulfides, chlorides, borides and mixtures thereof.

Another object of the invention is to provide an improved and highly efficient method and apparatus for deposition of insulating, metal compounds on a substrate utilizing improved control techniques.

Another object of the invention is to provide an improved method for deposition of thin films of insulating, metal compounds on a substrate at rates which are multiples of the rates of prior art sputtering techniques.

Another object of the invention is to provide an improved method for deposition of metal and semi-conductor compounds as thin films using sputtering techniques.

A further object of the invention is to provide a method for effecting efficient deposition of compounds by sputtering techniques utilizing a constant power, pulsed direct current power supply for the target material and control signals for controlling the admission of reactive gas wherein one signal is reflective of the voltage of the target power source and another signal is reflective of the partial pressure of the reactive gas used in the practice of the process.

These and other objects, advantages and features of the invention will be set forth in the detailed description as follows.

BRIEF DESCRIPTION OF THE DRAWING

In the detailed description which follows, reference will be made to the drawing comprised of the following figures.

DESCRIPTION OF THE PREFERRED EMBODIMENT

Overview And General Description

The method of the invention as well as the associated apparatus are designed to optimize the conditions for reaction between atomized target material and reactive gas to form and deposit a thin film compound in a sputtering system. Thus referring to FIG. 1, there is depicted the component parts of a sputtering system used to practice the invention.

Figure 1:
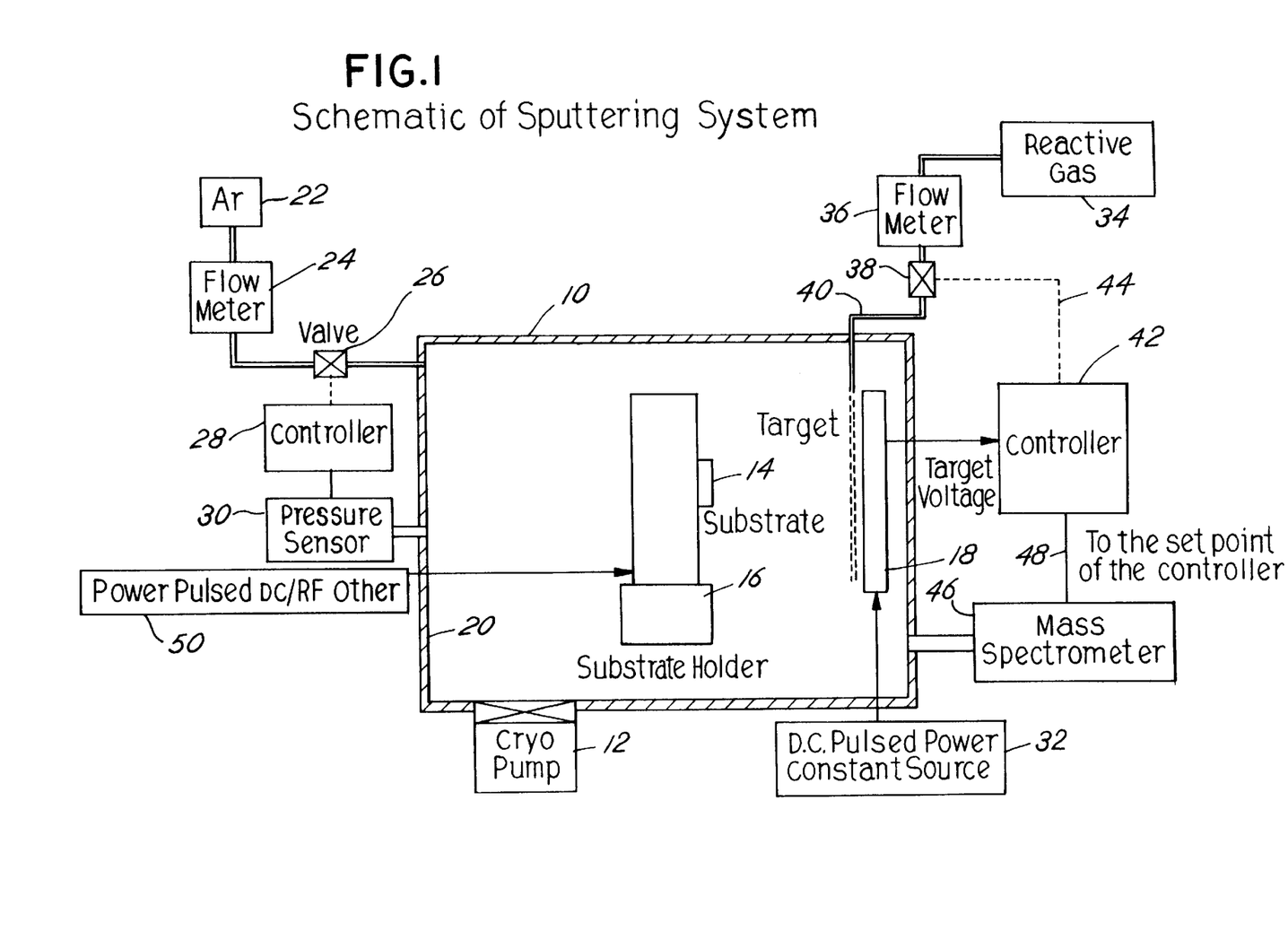
FIG. 1 is a schematic of a vacuum chamber and the control circuitry associated therewith for the practice of the method of the invention.

A vacuum chamber 10 is evacuated by a pump 12 after a substrate material 14, e.g. quartz or a piece of steel is mounted on a holder 16 within the chamber 10. A target material 18, e.g. Aluminum or some other metal or semi-conductor material, is also mounted within the chamber 10. The target 18 serves as a cathode in the process and the inside walls 20 of chamber 10 serve as an anode. An inert gas, e.g. Argon (Ar), is admitted to chamber 10 from a source 22 via a meter 24 and valve 26 controlled by a controller 28 responsive to a pressure sensor 30.

Figure 2:
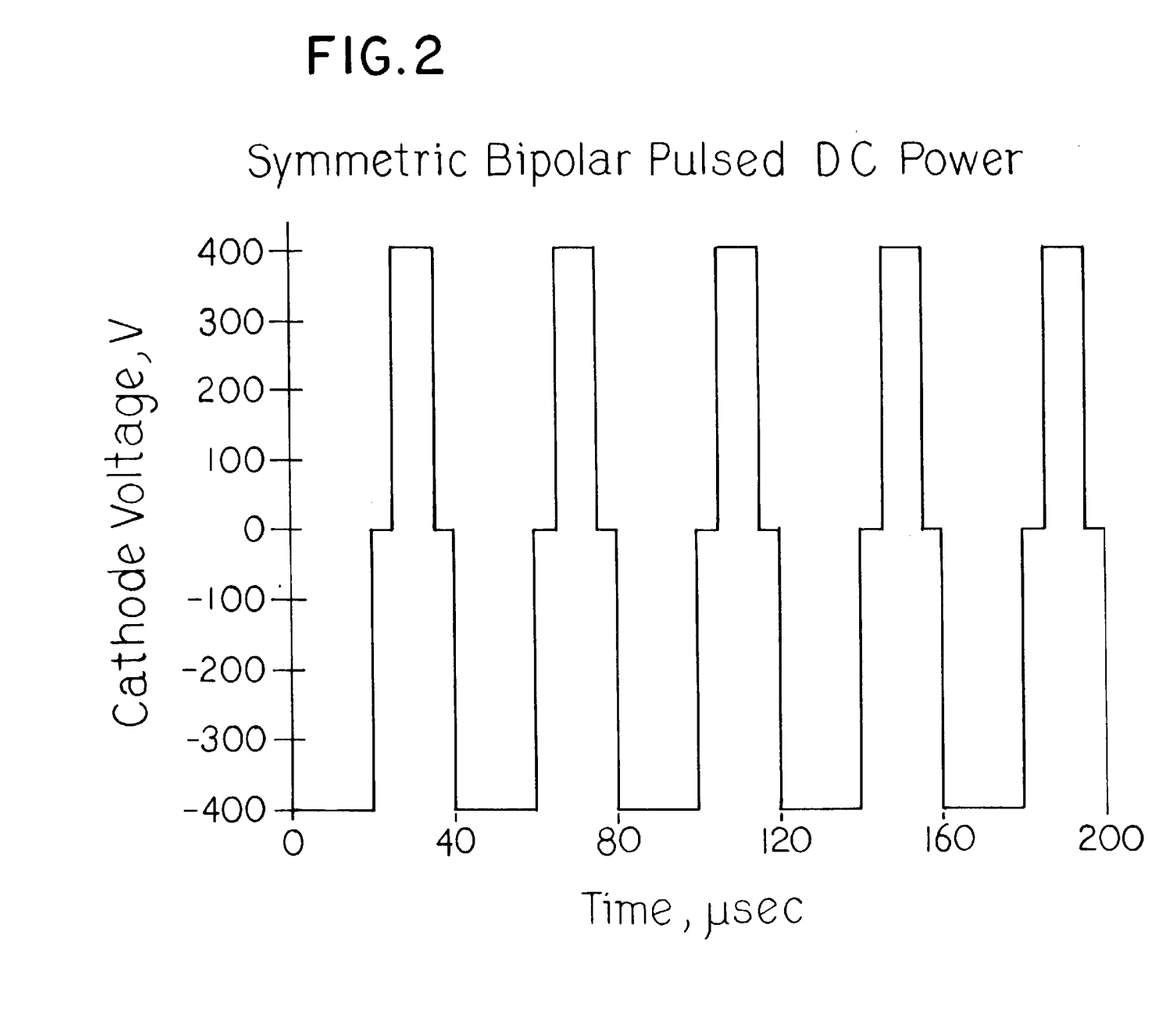
FIG. 2 is a graph depicting a symmetric, bipolar pulsed, direct current power supply wave.
Figure 3:
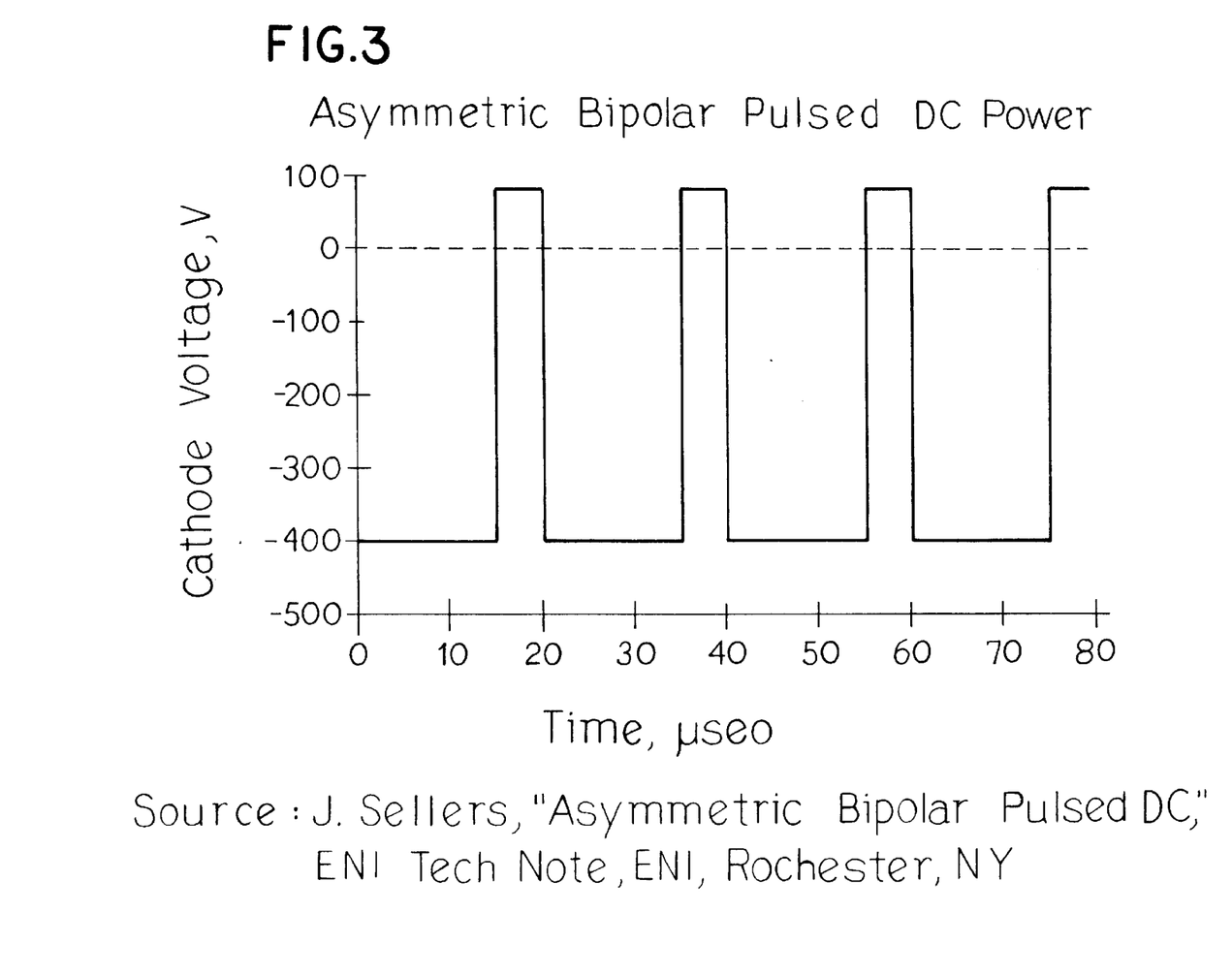
FIG. 3 is a graph depicting an asymmetric, bipolar pulsed direct current power supply wave.

The target 18 is subject to a bipolar, pulsed, direct current power source 32 of the type generally known in the art. The source 32 is preferably asymmetric as depicted in FIG. 3 with the cathode negatively biased, although a symmetric source 32, as depicted in FIG. 2, may be utilized.

A reactive gas, such as oxygen, is provided from a source 34 through a flow meter 36 and control valve 38 via a conduit 40 to the vicinity of the target 18 where its proximity to atoms from the target will enhance reaction therewith. The reactive gas control valve 38 is responsive to a plurality of sensing or feedback signals which are input to a controller 42 which, upon proper processing, provides a control signal via link 44 to valve 38.

Figure 4:
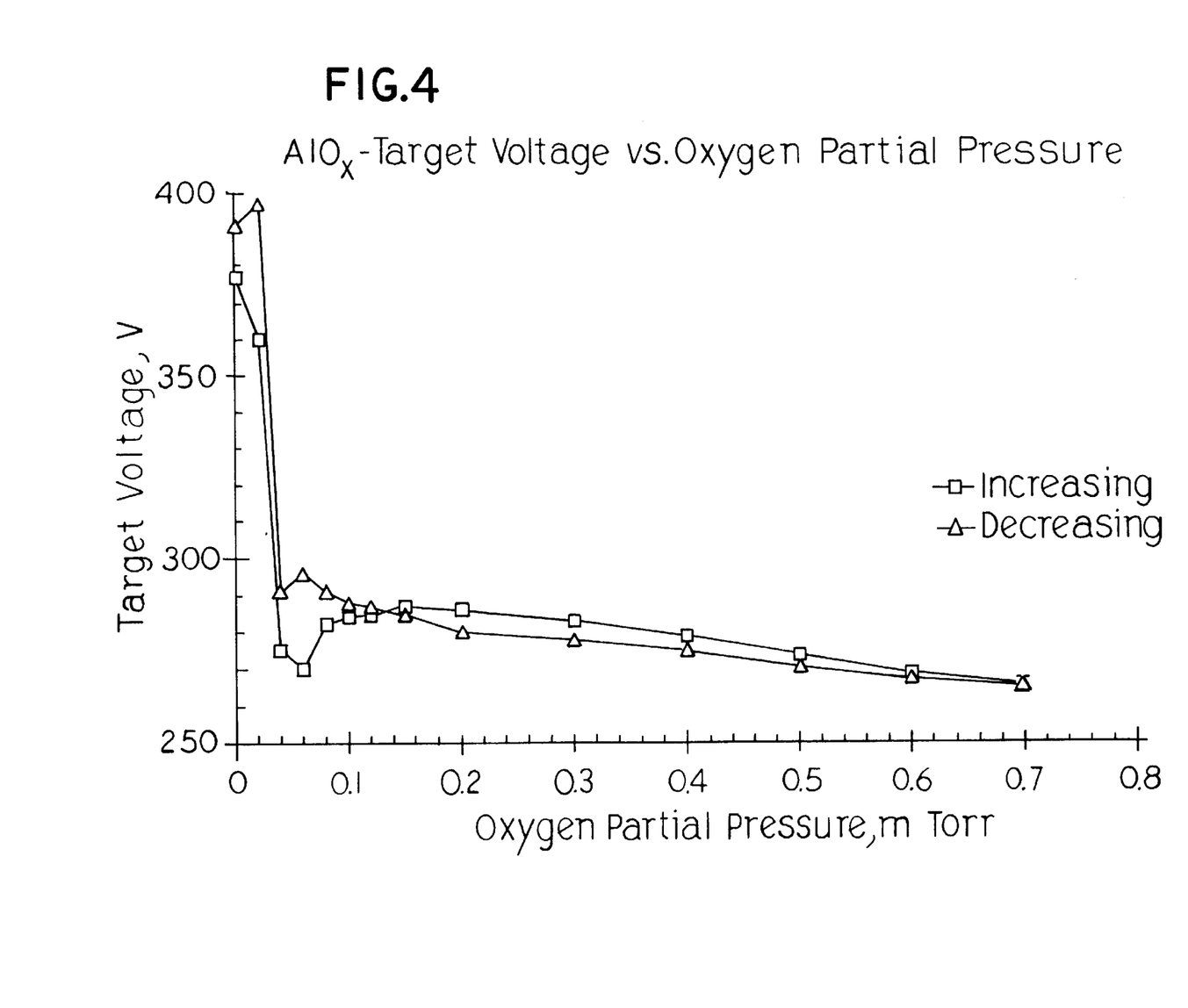
FIG. 4 is a graph depicting the target voltage/oxygen partial pressure hysteresis curve for the reactive sputtering of aluminum in an argon/oxygen atmosphere.

The signals to the controller 42 are derived from two sources, first the voltage of the target 18 is constantly monitored. Second, the partial pressure of the reactive gas is monitored. Regarding the voltage target 18, this voltage may vary since the power to the target 18 is maintained at a constant value. For each set of conditions within the chamber, therefore, for a given target and reactive gas, it is possible to derive the relationship between such constant power voltage and the partial pressure of the reactive gas thereby identifying the optimal range of partial pressure and voltage for formation of the compound comprised of the target material and reactive gas. An example of this empirical derivation is depicted in FIG. 4 for a target material of aluminum in an argon/oxygen atmosphere for increasing and decreasing oxygen partial pressure wherein the target power was 2 kilowatts from a 20 $kHz_3$ pulsed direct current source and the total chamber pressure was 4 mTorr. Note that partial pressure of about 0.03 mTorr at a target voltage of 270 to 380 volts is indicative of highly efficient film formation. This information or information of this type is derived from an experimental or test run, and the results are programmed into controller 42 thus enabling the controller 42 the capability to provide almost instantaneous feedback control input because voltage measurements provided to the controller 42 from target 18 are inherently rapid. Thus, the voltage feedback signal provides a highly sensitive, rapid response, control function, when empirical or full range test run, hystersis information derived from an experiment or full range test run of the type reflected by FIG. 4 is programmed into the controller 42.

Simultaneous with the rapid control signal derived from the voltage of target 18, a second less rapid signal is derived by directly measuring the partial pressure of the reactive gas, e.g. oxygen. Thus, as depicted in FIG. 1, a mass spectrometer 46, for example, or a partial pressure controller, e.g. an analyzer (OGC made by Leybold Infilon of East Syracuse, N.Y.) is provided to determine the partial pressure of the specific reactive gas. Note the signal derived from sensor 46 is species specific, e.g. oxygen; whereas the target voltage signal is not. Thus, the target voltage signal, previously described, may result, at least in part, due to phenomena other than the partial, pressure of the reactive gas. For example, out gassing from the substrate or chamber walls may have an impact on the signal. Thus, the reactive gas sensor 46 provides a signal 48 to the controller which is reflective of the true partial pressure of the reactive gas (oxygen) albeit a slowly developed or slowly derived signal relative to the target voltage signal because of the instrumentation involved.

Figure 5:
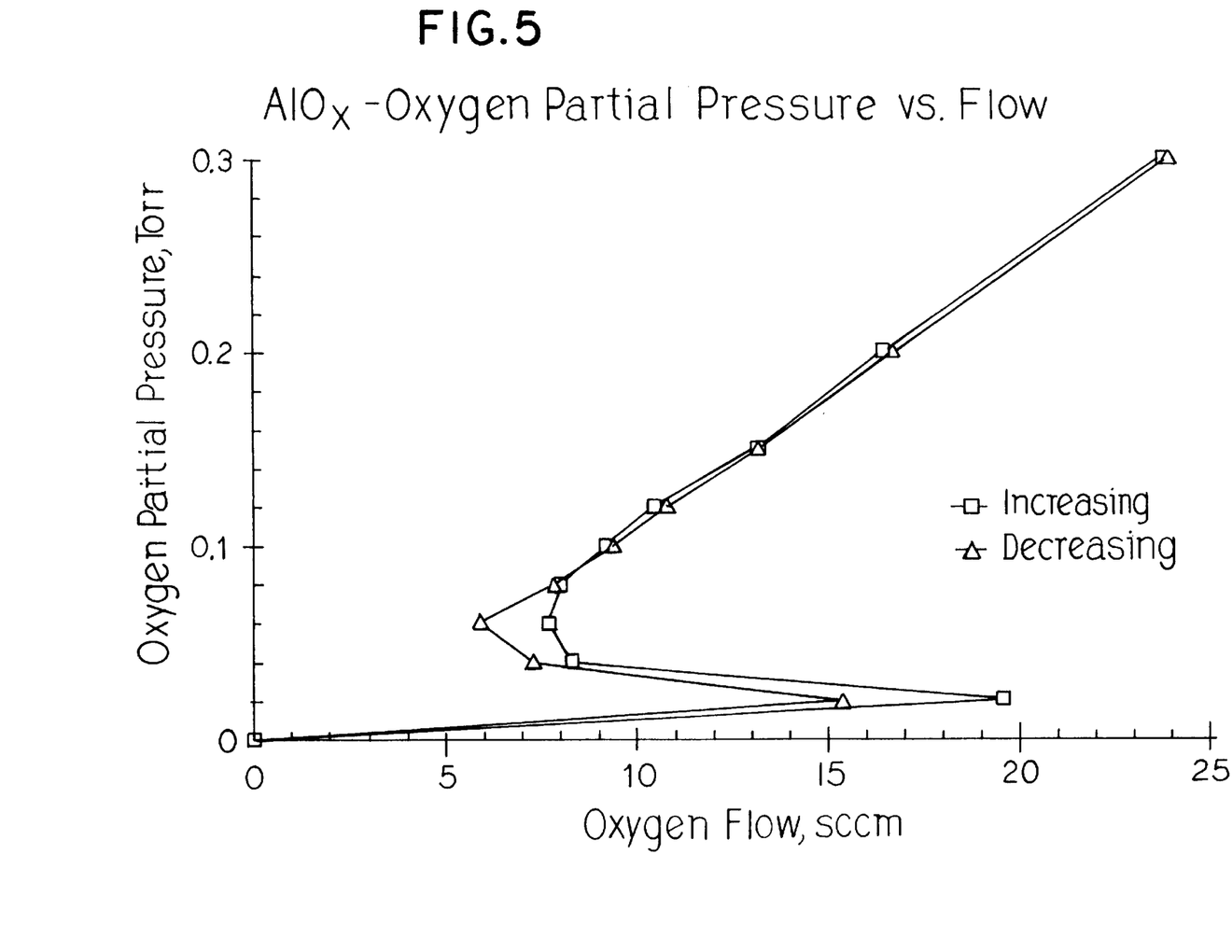
FIG. 5 is a graph depicting the oxygen reactive gas flow/oxygen partial pressure hysteresis curve for the reactive sputtering of aluminum in an argon/oxygen atmosphere.

In any event, the meaning of the signal 48 is also dependent upon the empirical relationship between reactive gas partial pressure and flow rate. This relationship is derived simultaneously with the empirical power voltage/partial pressure relationship discussed with regard to FIG. 4 for each specific set of conditions. FIG. 5 is a graph depicting the relationship for the same conditions (in fact, derived during the same empirical experimental run) as FIG. 4.

Referring to FIG. 5, for the reported conditions and materials, which is the same as specified for the data of FIG. 4, the optimal partial pressure is in the range of about 0.02 mTorr, at which point the oxygen flow is in the range of 15 to 20 Sccm. Thus, the signal 48 from sensor 46 can be utilized to "zero" or set the controller 42 so that the target voltage signal to controller 42 is working from an appropriate base line.

One further input to the system is provided to enhance the film deposition process. An energy source 50 provides a means for activating the reactive gas, e.g. Oxygen, at or near the substrate 14. For example, a pulsed direct current power supply may be applied to the substrate 14. Other energy sources include a radio frequency voltage source, lasers, electron beams, a microwave source, or an inductively coupled plasma source. A radio frequency source of 13.56 MHZ or a harmonic multiple thereof may be used. The energy input at the substrate 14 has the effect of enhancing the process efficiency as reflected by the data derived in FIGS. 4 and 5, by way of example, so as to increase flow rate and voltage at optimal conditions.

Also by correlating the data of the type derived in FIGS. 4 and 5 with various physical parameters of the film compound, it becomes possible to apply films having customized characteristics. For example, each of the data points of FIGS. 4 and 5 are representative of compounds having associated therewith a variety of measurable physical characteristics including conductivity, modulus, hardness, extinction coefficient, index of refraction, reflectivity, transmission and constituent composition. By controlling the sputtering process to such data points, as it is possible to do with this process, the desired custom film may be sputter applied to a substrate 14.

The process is especially useful in the deposition of insulating, metal compounds such as aluminum oxide. Experimental results demonstrate application rates 15 to 20 times better than prior techniques. For example, with the reactive sputtering of stoichiometric $Al_2O_3$, the deposition rate had been increased from about 5% of the metal deposition rate to 70% or more of the metal deposition rate. Also, the process is useful with many compounds including oxides, nitrides, carbides, sulfides, fluorides, chlorides, borides and mixtures thereof. Numerous metals, including aluminum, titanium, hafnium, zirconium, tantalum, silicon, and chromium have been successfully used as the target material.

Specific Example:

Following is a specific example of the practice of the invention:

Deposition of Aluminum Oxide by Means of Reactive DC Sputtering

Aluminum oxide (stoichiometric composition but noncrystalline) may be deposited using the following deposition system hardware:

The substrate to be coated is placed in a stainless steel vacuum chamber, approximately 29" o.d. and about 30" high, which is electrically grounded to earth potential and is pumped with a 6" diffusion pump and a 1500 1/s turbomolecular pump, which are both backed up with appropriately sized mechanical pumps (in this case, Edwards EM2-80's) capable of achieving a base pressure of $1 \times 10^{-6}$ Torr.

The substrate may be a flat glass slide or other material of choice, which is mounted on the 5"-diameter, rotatable substrate table. The closest approach of the substrate to the target is about 3" and it may be rotated or held stationary during coating.

Two nominally 5"×15" rectangular MRC Inset targets are mounted vertically, opposing one another about 11" apart with the substrate table in between. The cathodes are an unbalanced magnetron design, which enhances the plasma density in the vicinity of the substrate, and at least one target is aluminum with a metallic purity of at least 99.99%.

The cathodes (targets) are each connected to Advanced Energy MDX 10 kW dc power supplies through 20 kHz Sparc-Le (or higher frequency) units which together provide a pulsed dc power and suppression of arcing on the target surface during sputtering.

The substrate table is connected to a 3 kW rf power supply, and the induced dc voltage is read out through a meter which is shielded from rf power by means of an appropriate filter.

The total gas pressure in the chamber is monitored by a Baratron (capacitance manometer) for sputtering pressures (1–10 mTorr), and lower pressures are monitored with a Bayard-Alpert type ionization gauge. The ionization gauge is also used as a reference in checking the calibration of the partial pressure sensors (OGC or mass spec.), or a more stable instrument such as a spinning rotor gauge can be used and is preferred if available.

The partial pressures of all gases in the system are monitored with an Inficon Quadrex 100, quadrupole mass spectrometer, and two of the gases (oxygen and argon) are monitored with an Inficon OGC (Optical Gas Controller). The mass spectrometer is attached to a sampling system which is differentially pumped, since it requires an operating pressure that is typically in the $10^{-6}$ Torr range, and is mounted to the top of the chamber. The OGC is attached directly to the back of the chamber through a standard KF flange, since it operates at sputtering pressures.

The gas flow controllers are MKS model 260 with modifications that allow them to respond to pressure signals instead of flow signals. In this case, the total pressure is maintained constant by a feedback control involving the Baratron and the MKS controller. The target voltage on the aluminum target is used as the primary indicator of oxygen partial pressure during sputtering and is used as a feedback signal to the MKS controller which operates the inlet valve for a quick response to any deviations in partial pressure (voltage). Since the voltage is not a unique signal with respect to the partial pressure of oxygen, the OGC or the mass spectrometer is used to provide a feedback signal for the voltage set point, which is thus tied to the actual desired level of oxygen partial pressure. This OGC or mass spectrometer value is updated more slowly than the voltage. This dual feedback loop provides a fast response that optimizes the process control and maintains a unique relationship between the control set points and the selected partial pressure of oxygen.

In order for the process to function in the preferred manner, one desires to also establish an anode surface in close proximity to the plasma but shielded from deposition, since the insulating film produced in the process will cause the anode to become non-functional if not protected and would cause the process to stop.

Deposition protocol:

The appropriate partial pressure of oxygen has been previously selected from an initial determination of the hysteresis curve, which relates the gas flow (see FIG. 5) and the target voltage (see FIG. 4) to the set partial pressure of oxygen in a fixed and determinable way for a given system and given operating conditions. The partial pressure that is selected will be that which uses the least amount of reactive gas and still makes a coating with the desired properties. Once the partial pressure of $O_2$ has been determined that corresponds to the desired properties of the oxide coating (e.g., optically clear), and the target voltage for that partial pressure is known, the necessary set points for the process can be inserted into the controllers.

The following operating parameters are set:

The power supply (with Sparc-Le unit) is set for a constant power of 2 kW.

The target voltage set point is set to achieve a level of −340 volts.

The MKS controller/Baratron is set to adjust the argon flow to maintain a constant total pressure of 8 mTorr.

The partial pressure set-point is set for 0.03 mTorr on the OGC (actual numbers may vary depending on the calibration of the pressure gauges used, but the relative location on the hysteresis curve will not vary for a coating of a given composition, deposited at a given rate).

It is preferred, for example, to bias the substrate by adjusting the rf power supply to 1 kW.

The coating thus produced is clear and insulating and the rate of deposition is about 1600 Å/min, compared to the pure metal deposition rate of about 2000 Å/min.

Following is a table which summarizes experimental results associated with various film compounds applied by the process using the apparatus of the invention:

TABLE OF METAL-OXIDE DEPOSITION EXPERIENCE

| Metal | Compound (could choose non-stoichiometric) | Target Power, kW | Target Voltage, V | Reactive Gas partial pressure, mTorr | Substrate bias voltage, V | Pure metal deposition rate, Å/min | Oxide deposition rate, Å/min |
|---|---|---|---|---|---|---|---|
| Al | $Al_2O_3$ | 2 | −340 | 0.03 | floating | 2000 | 1600 |
| Ti | $TiO_2$ | 5 | −480 | 0.1 | −100 | 2500 | |
| Zr | $ZrO_2$ | 5 | −358 | 0.06 | −150 | 3400 | |
| Hf | $HfO_2$ | 5 | −507 | 0.28 | −100 | 3000 | |
| Cr | $Cr_2O_3$ | 5 | −530 | 0.22 | −100 | 4000 | |

It is to be noted that various operational parameters may be varied such as the substrate energy input (bias voltage), the target power and the ambient as well as reactive gas pressure and nominal target voltage. Such changes may be incorporated in the process and apparatus without departing from the spirit and scope of the invention. Thus, the invention is to be limited only by the following claims and their equivalents.

What is claimed is:

1. A method for deposition of a film comprising a compound by sputtering means onto a substrate, which film is conducting or non-conducting and which film includes a metallic or semi-conducting element derived from a metallic or semi-conducting sputtering target, said metallic or semi-conducting element being combined with at least one additional element in the form of a reactive gas to form the compound, said method comprising the steps of:

(a) providing a target as a cathode in a vacuum chamber of the metal or semi-conductor to be combined with the reactive gas to form the compound;

(b) providing an inert gas in the chamber that becomes ionized and bombards the target to release metal or semi-conductor atoms and ions therefrom into the chamber;

(c) providing the substrate in the chamber to be coated with the compound comprised of the reactive gas and the metal or semi-conductor;

(d) providing an anode in the chamber;

(e) admitting the reactive gas into the chamber, said reactive gas capable of forming the compound in combination with atoms and ions from the target;

(f) supplying pulsed, direct current, electrical power to the target to effect ionization of the inert gas and thereby effect bombardment of the target to release atoms and ions from the target into the chamber for combination with the reactive gas; and (g) controlling the admission and reaction of the reactive gas by:

(i) maintaining constant power to the target;

(ii) measuring substantially instantaneously a target voltage and providing a first voltage measurement signal for controlling the rate of admission of the reactive gas to the chamber to achieve partial pressure reflective of a compound composition having defined physical characteristics, said first voltage measurement signal comprising an independent measurement indicative of the partial pressure in the system which is not reactive gas species specific, which provides a signal characteristic of the optimal range of partial pressure for reaction of the reactive gas;

(iii) simultaneously measuring the species specific partial pressure of the reactive gas and providing a second signal for controlling the rate of admission of the reactive gas to the chamber and to control the partial pressure range for measurement and control by the first voltage measurement signal to achieve partial pressure control reflective of the said compound composition, both said first voltage measurement signal and said second signal being used to control admission of reactive gas to the chamber simultaneously, said first voltage measurement signal being measured at a faster rate than the second signal; and (iv) simultaneously activating the reactive gas at or near the substrate by introducing a localized energy input thereto.

2. The method of claim 1 wherein the target is a metal and said film is non-conducting.

3. The method of claim 1 including deposition of the film on the substrate at a rate at least about 50% of the rate of deposition of metal or semi-conductor element at substantially the same power conditions.

4. The method of claim 1 wherein controlling admission of the reactive gas in response to the target voltage is more rapid than in response to measuring the partial pressure of the reactive gas.

5. The method of claim 1 wherein the compound is taken from the group consisting of oxides, nitrides, carbides, sulfides, fluorides, chlorides, borides and mixtures thereof.

6. The method of claim 1 wherein the metal is taken from the group consisting of aluminum, titanium, hafnium, zirconium, tantalum, silicon, chromium and mixtures thereof.

7. The method of claim 1 wherein the power is a symmetric, bipolar pulsed direct current power pulsed in the range of about 2 to 250 kHz.

8. The method of claim 1 wherein the power is an asymmetric bipolar pulsed direct current power pulsed in the range of about 2 to 250 kHz.

9. The method of claim 1 wherein the localized energy input is taken from the group consisting of pulsed direct current power supply applied to the substrate; a radio frequency voltage source applied to the substrate, a laser activation source, an electron beam source, a microwave source, and an inductively coupled plasma source.

10. The method of claim 1 wherein the localized input energy is a radio frequency source of 13.56 MHz or a harmonic thereof.

11. The process of claim 1 wherein the step of measuring the partial pressure of the reactive gas comprises measuring with an optical gas analyzer or mass spectrometer.

12. The process of claim 1 wherein said physical characteristics are selected from the group comprising: constituent composition, reflectivity, transmission, index of refraction, extraction coefficient, hardness, modulus, conductivity, and combinations thereof.

13. Apparatus for deposition of a film comprising a compound by sputtering means onto a substrate, which film is conducting or non-conducting and which film includes a metallic or semi-conducting element derived from a metallic or semi-conducting sputtering target, said metallic or semi-conducting element being combined with at least one additional element in the form of a reactive gas to form the compound, said apparatus comprising, in combination:

(a) a vacuum chamber (b) a target as a cathode in the vacuum chamber of the metal or semi-conductor to be combined with the reactive gas to form the compound;

(c) an inert gas source to the chamber to supply inert gas that becomes ionized and bombards the target to release metal or semi-conductor atoms and ions therefrom into the chamber;

(d) a substrate support in the chamber for a substrate to be coated with the compound;

(e) an anode in the chamber;

(f) a reactive gas source to the chamber, said reactive gas capable of forming the compound with atoms and ions from the target for coating the substrate;

(g) means to supply pulsed, direct current, electrical power to the target to effect ionization of the inert gas and to effect bombardment of the target to release atoms and ions from the target into the chamber; and (h) means for controlling the admission and reaction of the reactive gas including:

(i) means for maintaining constant power to the target;

(ii) means for measuring the target voltage to provide a first signal for controlling the rate of admission of the reactive gas to the chamber to achieve partial pressure reflective of a compound composition having defined physical characteristics, said first signal measuring means comprising an independent measurement indicative of the partial pressure in the system which is not reactive gas species specific and which provides a signal characteristic of the optimal range of partial pressure for reaction of the reactive gas;

(iii) means for simultaneously measuring the species specific partial pressure of the reactive gas to provide a second signal for controlling the rate of admission of the reactive gas to the chamber within the optimal range defined by the means for providing the first signal to control partial pressure to be optimally reflective of the said compound composition, both said first and second signals being used simultaneously to control admission of reactive gas to the chamber, said means for controlling providing the first signal at a faster rate than the second signal; and (iv) means for simultaneously activating the reactive gas at or near the substrate by introducing a localized energy input thereto.

\* \* \* \* \*